United States Patent [19]

Rountree

[11] Patent Number: 5,060,037
[45] Date of Patent: Oct. 22, 1991

[54] OUTPUT BUFFER WITH ENHANCED ELECTROSTATIC DISCHARGE PROTECTION

[75] Inventor: Robert N. Rountree, Richmond, Tex.

[73] Assignee: Texas Instruments Incorporated, Dallas, Tex.

[21] Appl. No.: 550,228

[22] Filed: Jul. 10, 1990

Related U.S. Application Data

[63] Continuation of Ser. No. 334,732, Apr. 6, 1989, which is a continuation of Ser. No. 34,465, Apr. 3, 1987.

[51] Int. Cl.$^5$ .................. H01L 29/78; H01L 29/40
[52] U.S. Cl. .......................... 357/23.13; 357/42; 357/13; 357/23.14
[58] Field of Search ............... 357/23.13, 42, 51, 13, 357/23.14, 52

[56] References Cited

U.S. PATENT DOCUMENTS

| | | | |
|---|---|---|---|
| 3,821,781 | 6/1974 | Chang et al. | 357/42 |
| 4,062,039 | 12/1977 | Nishimura | 357/23.13 |
| 4,616,243 | 10/1986 | Minato et al. | 357/23.13 |
| 4,626,882 | 12/1986 | Cottrell et al. | 357/23.13 |

*Primary Examiner*—Jerome Jackson, Jr.
*Attorney, Agent, or Firm*—Ronald O. Neerings; N. Rhys Merrett; Melvin Sharp

[57] ABSTRACT

A CMOS output buffer is disclosed, which provides ESD protection by incorporating a low resistance path within the p-channel pull-up device. Output buffers according to the prior art can be damaged by ESD occurring at the output terminal having a positive polarity, as the drain-to-substrate diode of the pull-down transistor breaks down in the reverse-bias direction, especially when second breakdown occurs. The p-channel pull-up device, formed within an n-well, is fabricated to have n-type diffusions disposed near to the p-type drain diffusions. The distance between the n-type diffusion and the drain diffusions in the pull-up device reduces the series "on" resistance of the drain-to-n-well diode of the pull-up device, to a level which keeps the voltage at the output terminal below the reverse-bias breakdown voltage of the drain-to-substrate diode in the pull-down device. The pull-up device may be constructed in a ladder structure to facillitate the reduction of this resistance. A further embodiment of the invention is disclosed which provides the same protection to the n-channel pull-down device, by way of an n-well diode with low series resistance, for open-drain or other pull-up configurations.

34 Claims, 5 Drawing Sheets

OUTPUT BUFFER WITH ENHANCED ELECTROSTATIC DISCHARGE PROTECTION

This application is a Continuation, of application Ser. No. 07/334,732, filed Apr. 6, 1989, which is a continuation of application Ser. No. 07/034,465, filed on Apr. 3, 1987.

This invention relates to integrated circuits, and more specifically to output buffers in complementary metal-oxide semiconductor integrated circuits.

BACKGROUND OF THE INVENTION

A well known cause of failure for electronic integrated circuits is exposure to large and sudden electrostatic discharge. During the manufacture and use of integrated circuits, both equipment and personnel can build up substantial amounts of charge, often by triboelectric charge buildup during the contact and subsequent removal of dissimilar materials from one another. The built-up electrostatic charge can be quickly discharged when the charged item comes in contact with an integrated circuit, especially when portions of the circuit are connected to power supplies, including equipment ground. The discharge can cause significant damage to the integrated circuit by way of dielectric breakdown of oxides and other thin films, and also by high levels of conduction through relatively small areas of the circuit arising from reverse breakdown of p-n junctions on the circuit. Especially damaging results can occur if the diode enters the negative resistance region of its diode breakdown characteristics, as sufficient conduction can occur to melt conductive material such as polysilicon or aluminum, via resistive heating. The molten material can flow along the lines of the electric field to create a short circuit, such as a source-to-drain short in a MOSFET. This short circuit will remain after the electrostatic discharge has completed, and is likely to render the integrated circuit useless.

Quantification of the sensitivity of an integrated circuit to electrostatic discharge can be measured by subjecting a sample of integrated circuits to known electrostatic discharge conditions, where the amount of charge and the discharge characteristics of the charge can be controlled in a known manner. A test method is given in a standard "Test Methods and Procedures for Microelectronics", MIL-STD-883C, Method 3015.3, published by the United States Department of Defense. This method uses a "human body model" consisting of a 100 pF capacitor in series with a 1500 ohm resistor; empirical data has shown that subjecting the integrated circuit to discharge via this equivalent circuit is a good approximation for electrostatic discharge from a human being. By iteratively increasing the voltage to which the capacitor is charged prior to discharging it to a terminal of the circuit, measurement of the sensitivity threshold of a given circuit design may be made. A low failure threshold, such as 2000 volts or lower, for a circuit may require that special precautions must be taken during the handling of the circuit during its manufacture and use, adding to the production costs of both the manufacturer and the user. Of course, the number of actual electrostatic discharge failures for a particular integrated circuit will be higher for a more sensitive circuit, further adding to the costs of manufacture and use. It is clearly advantageous for both the manufacturer and the user of integrated circuits for the failure threshold to be at as high a voltage as possible.

In order to reduce the sensitivity of integrated circuits to electrostatic discharge ("ESD"), modern integrated circuits have been designed and manufactured which have protection devices at their external terminals. The intent of including such protection devices is to provide a "safe" path for the electrostatic charge to follow, such a safe path designed in such a manner that no damage occurs when electrostatic discharge occurs from a charged body to the associated terminal. These circuits have included the use of diffusion resistors and punch-through diodes. An example of such a protection device is the thick field oxide transistor described in copending application Ser. No. 617,876, filed June 6, 1984. An example of a protection device for complementary metal-oxide-semiconductor (CMOS) integrated circuits is described in copending application Ser. No. 027,103, filed Mar. 13, 1987 and assigned to Texas Instruments Incorporated.

Traditionally, output buffer circuits have not included such devices for various reasons. In integrated circuits having sufficiently large geometries, the transistors in the push-pull output buffer have been sufficiently large to safely handle fair amounts of electrostatic discharge current presented at the output terminal. The performance of the output terminal relative to electrostatic discharge protection was thus often better than the input terminals of the device. Since the electrostatic discharge protection within an integrated circuit is no better than that of its weakest terminal, little incentive existed to improve the performance of the output buffer as long as the input terminals remained weaker than the push-pull drive circuit. In addition, the attachment of protection devices to the output terminals of an integrated circuit frequently provides no protection, as the turn-on voltage of such protection devices is frequently greater than that of the output drive circuitry itself for an ESD event.

As the technology for producing integrated circuits has become more advanced, the geometries used in realizing the components within the integrated circuit have become smaller, thereby reducing the silicon cost of the circuit and increasing its operational performance. However, as the transistor sizes have become smaller, the ability of the push-pull output buffer to safely discharge electrostatic charge without damage to the circuit has reduced. In addition, the improvements to the input terminals of integrated circuits beyond the protection provided by the push-pull drive circuit has now, for some circuits, focused the emphasis of electrostatic discharge protection onto the output buffer.

It is therefore an object of this invention to provide an output buffer which has improved ESD sensitivity.

It is a further object of this invention to provide such an output buffer compatible with CMOS technology.

It is a further object of this invention to provide such an output buffer by providing a shunt current path which keeps the terminal voltage below the avalanche threshold of the reverse-biased diode appearing at said terminal.

Other objects of this invention will become apparent to those of ordinary skill in the art having reference to this specification, accompanied by the drawings.

SUMMARY OF THE INVENTION

The invention protects a semiconductor circuit from reverse bias breakdown which can result during an electrostatic discharge event. In one embodiment, an n-channel field effect transistor is fabricated in a p-type region of the substrate, and has a drain connected to the output of the output buffer, a source connected to a first reference supply, and a gate controlled by an input to the output buffer. A diode is formed by a p-type diffusion formed within an n-type region of the substrate such as an n-well in CMOS technology. The p-type diffusion is connected to the output of the output buffer. The n-well is connected to a second reference supply at a point near the p-type diffusion, such connection made preferably to an n-type diffusion within the n-well. The distance between the p-type diffusion and the connection to the n-well is limited to that which provides a low enough "on" resistance, in the event that the diode goes into forward conduction—the p-type region is biased positively relative to the second reference supply, that the p-n junction formed by the drain of the n-channel device does not go into reverse-bias breakdown, thereby preventing damage to the circuit. The diode can be incorporated into the p-channel pull-up device in a CMOS output buffer.

DETAILED DESCRIPTION OF THE PREFERRED EMBODIMENT

Figure 1:
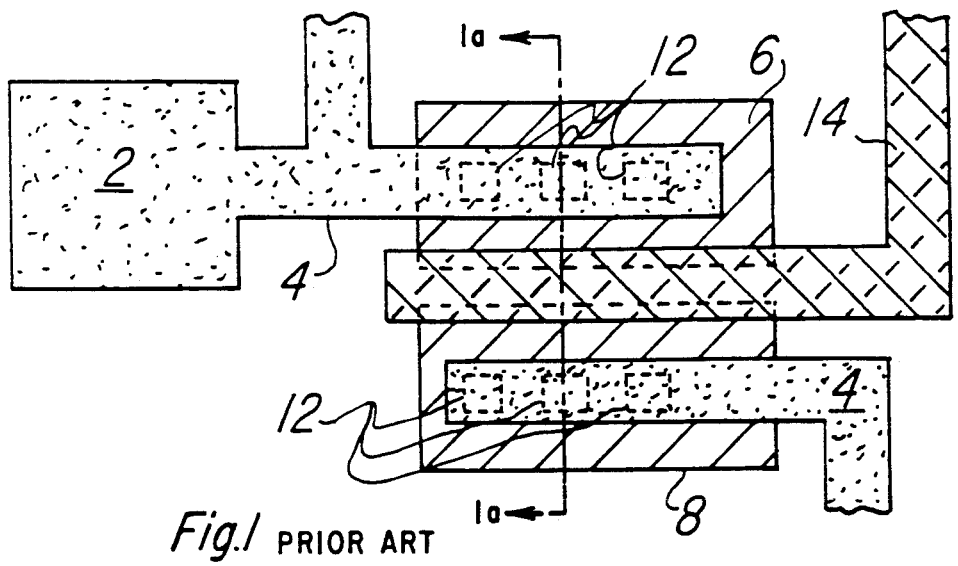
FIG. 1 is a plan view of an n-channel pull-down transistor in an output buffer constructed according to the prior art.
Figure 1A:
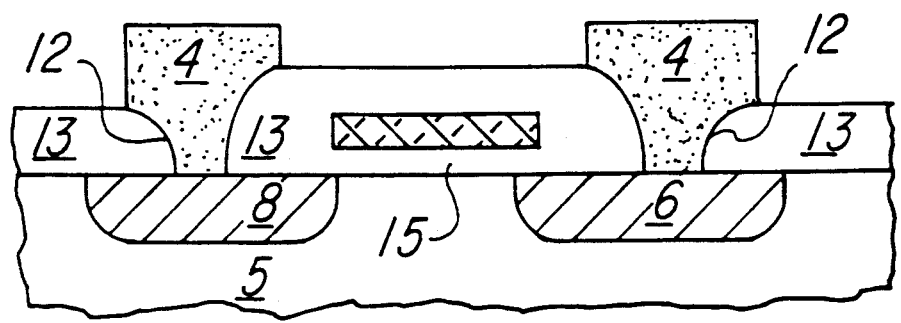
FIG. 1a is a cross-sectional view of the transistor of FIG. 1.

Referring now to FIGS. 1 and 1a, an n-channel transistor 10 is illustrated as used in the pull-down device in a push-pull output buffer according to the prior art. Since transistor 10 is n-channel, it is fabricated in a p-type substrate 5 of a silicon chip. Bond pad 2 serves as the output terminal, and is connected, by way of aluminum or other metallization lines 4, to drain regions 6 of transistor 10. Source regions 8 are connected, also by way of metallization lines 4, to a reference supply $V_{ss}$ which serves as ground for the integrated circuit. Source regions 8 and drain regions 6 are each n-type diffusions into the p-type substrate, such diffusions fabricated by way of well known diffusion processes such as ion implantation followed by a drive-in diffusion. Connection between the diffusions 6 and 8 and metal lines 4 is made by way of contacts 12, such contacts being patterned and etched vias in the dielectric film 13 which otherwise isolates the diffusions 6 and 8 from metal lines 4. Gate electrode 14 overlaps the spaces between source regions 8 and drain regions 6, separated therefrom by a thin gate oxide 15, and is connected to the input node of the output buffer. Gate electrode 14 can be constructed from polysilicon, and is generally deposited and patterned prior to the diffusion for source regions 8 and drain regions 6, resulting in a self-aligned MOS transistor, as is well known in the art. FIG. 1a shows a cross-sectional view of a portion of transistor 10 of FIG. 1, specifically illustrating gate oxide 15.

If an electrostatic charge having a negative potential relative to $V_{ss}$ is applied to bond pad 2, the p-n junction at the interface of drain region 6 and the p-type substrate 5 will be forward biased. This forward biased diode is capable of carrying large currents to the power supply to which substrate 5 is connected, and accordingly the output buffer using transistor 10 has a high failure threshold (commonly 8000 volts according to the above-referenced Method 3015.3, in the case where the channel length of transistor 10 is approximately 2 microns).

For an electrostatic charge with a positive potential relative to $V_{ss}$, however, the diode between drain region 6 and sustrate 5 will be reverse-biased. Once the voltage presented by the ESD event exceeds the reverse bias breakdown voltage of this diode, however, conduction will occur from drain region 6 to source region 8, via substrate 5. This occurs because of the parasitic n-p-n bipolar transistor in the illustrated structure, considering drain region 6 as the collector, substrate 5 as the base, and source region 8 as the emitter. This conduction can, depending upon the level of the discharge, protect the remainder of the integrated circuit. However, significant heat is generated by the conduction of the current through the reverse biased diode in breakdown. The generation of resistive heat is aggrevated by the thermal generation of intrinsic carriers in substrate 5, causing the parasitic n-p-n transistor to enter second breakdown, further increasing the flow of current from drain region 6 to source region 8 and generating even further resistive heat. If the resistive heating is sufficiently high, metal 4 in contact 12 may melt, and flow along the lines of the electric field to source region 8, as illustrated by filament 4' in FIG. 1b. In addition, the generated heat may reach gate electrode 14 through thin gate oxide 15, causing a polysilicon filament 14' shorting gate electrode 14 to drain region 6, or even causing a polysilicon filament 14" to short gate electrode 14 to source region 8. Such filaments will of course render the transistor inoperable.

Figure 1B:
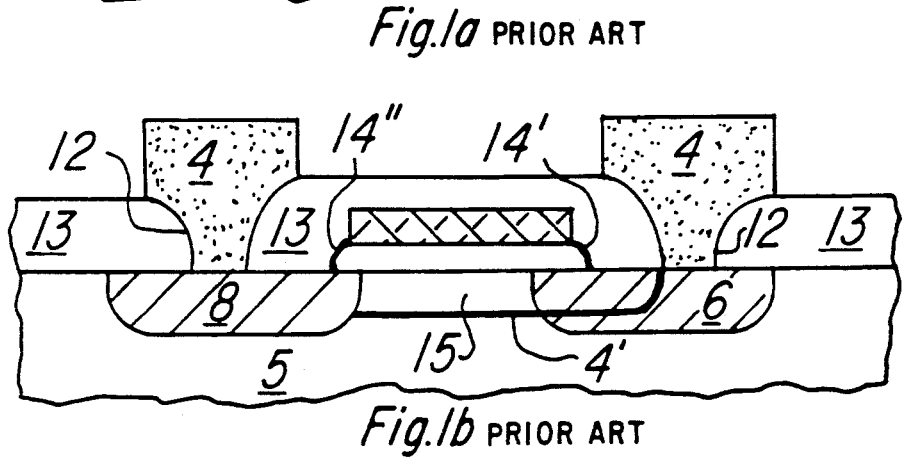
FIG. 1b is a cross-sectional view of the transistor of FIG. 1, illustrating typical failure modes resulting from an ESD event.
Figure 1C:
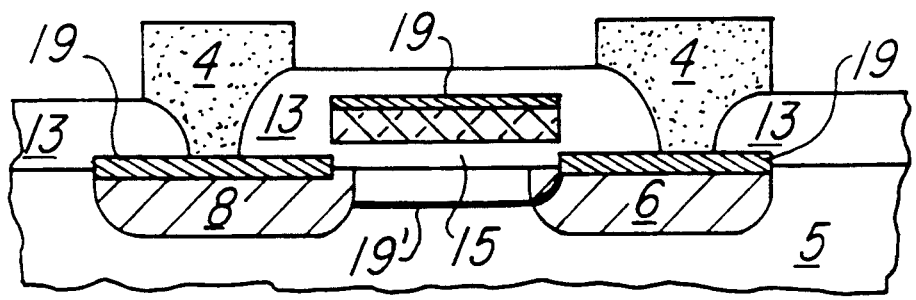
FIG. 1c is a cross-sectional view of the transistor of FIG. 1 incorporating a silicide film on the conductors, illustrating another typical failure mode resulting from an ESD event.

Recent advances in the fabrication of integrated circuits have been directed to the reduction of the series resistance of conductive material therewithin. One of these advances has included the "cladding" of diffusion and polysilicon conductors with a silicide film. Such cladding is done by way of a direct reaction between a metal such as titanium and the underlying single-crystal silicon or polysilicon layer, resulting a layer of titanium silicide on the surface of the silicon. Referring to FIG. 1c, a cross-sectional view of a transistor formed with clad diffusion regions and polysilicon is illustrated. Silicide film 19 is illustrated at the surface of drain region 6, source region 8 and gate electrode 14. FIG. 1c also illustrates that the failure threshold of transistor 10 is decreased when silicide film 19 is used to reduce the resistance of these layers, as filaments 19' of silicide can form due to the heat generated by the reverse bias conduction described above. The failure threshold is reduced, since the distance between the filament-forming material (in this case silicide 19) and the locally hot point (the junction between drain region 6 and substrate 5) is shorter than in the case illustrated in FIG. 1b where the aluminum metal line 4 provides the filament material.

Figure 2:
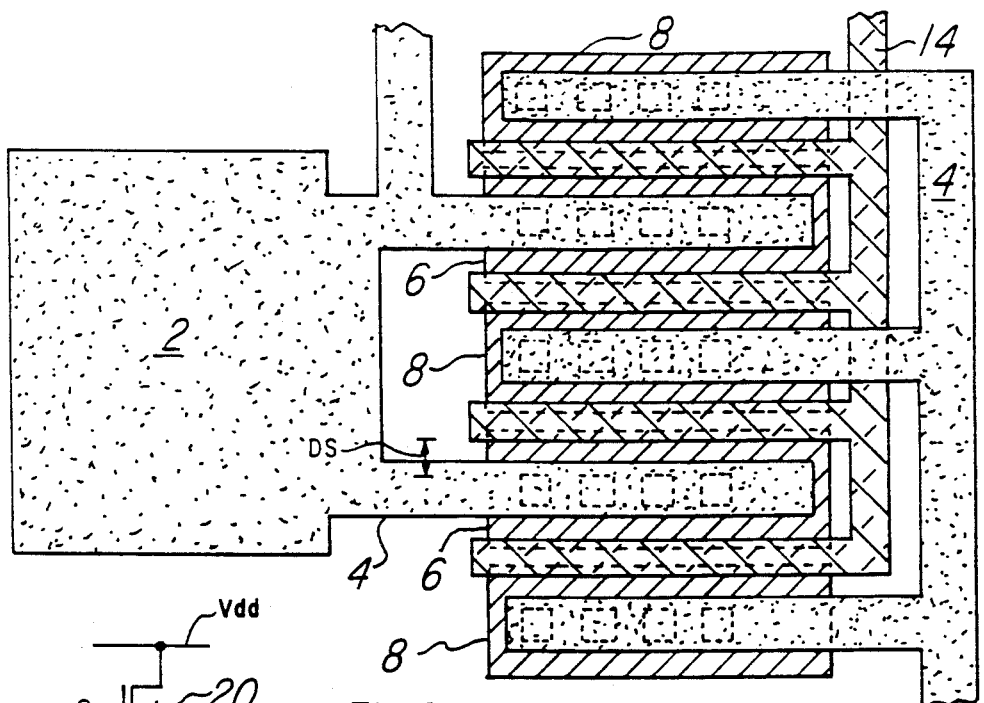
FIG. 2 is a plan view of an n-channel pull-down transistor in another output buffer constructed according to the prior art.

Certain techniques have been utilized to improve the threshold of an output buffer utilizing an n-channel transistor as the pull-down device. Referring now to FIG. 2, an approach utilized in the prior art is shown which has been shown to increase the failure threshold of transistor 10 for positive-biased ESD events. Transistor 10 is constructed according to a "ladder" structure, with multiple drain regions 6 and source regions 8, each with gate electrodes 14 disposed therebetween. The ladder structure shown in FIG. 2 will provide for an effective transistor width which is four times that of transistor 10 of FIG. 1 (assuming all other dimensions equal), thereby reducing the local current density at the p-n junction at the edges of drain regions 6 in reverse bias breakdown, accordingly reducing the associated localized heating accordingly. In addition, the formation of metal filaments 4' as shown in FIG. 1b can be minimized by spacing the contact 12 a sufficient distance from gate electrode 14, as shown in FIG. 2 by the dimension DS, so that the localized heat at the edge of drain region 6 is dissipated prior to reaching metal line 4.

Figure 3:
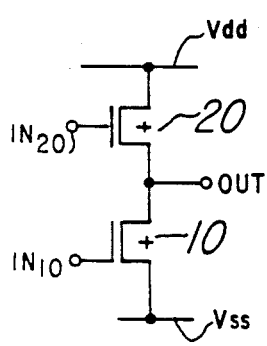
FIG. 3 is a schematic diagram of a CMOS output buffer.

Similar phenomena occur in the ESD stress of CMOS output buffer circuits. An inverting push-pull output buffer circuit as realized in CMOS is schematically illustrated in FIG. 3. In this configuration, p-channel transistor 20 serves as the pull-up device, while n-channel transistor 10 serves as the pull-down device, as referred to above. The source-to-drain path of p-channel transistor 20 is connected between positive supply voltage $V_{dd}$ (at the source of transistor 20) and the output terminal OUT (at the drain of transistor 20), while the source-to-drain path of n-channel transistor 10 is connected between reference supply $V_{ss}$ (the source of transistor 10) and the output terminal OUT (drain of transistor 10). The gate of transistor 10 is connected to an input $IN_{10}$ to the output buffer, and the gate of transistor 20 is connected to an input $IN_{20}$ to the output buffer, inputs $IN_{10}$ and $IN_{20}$ being generated according to the function of the integrated circuit. Input $IN_{10}$ is substantially the logical complement of input $IN_{20}$, so that the output buffer of FIG. 3 is substantially operative as a CMOS inverter, but the inputs $IN_{10}$ and $IN_{20}$ are delayed from one another so that so that transistor 10 and transistor 20 are not simultaneously conductive during the switching of terminal OUT. Such delay can be provided by pre-driver logic circuitry used to generate inputs $IN_{10}$ and $IN_{20}$, as is well known in the art.

Figure 4A:
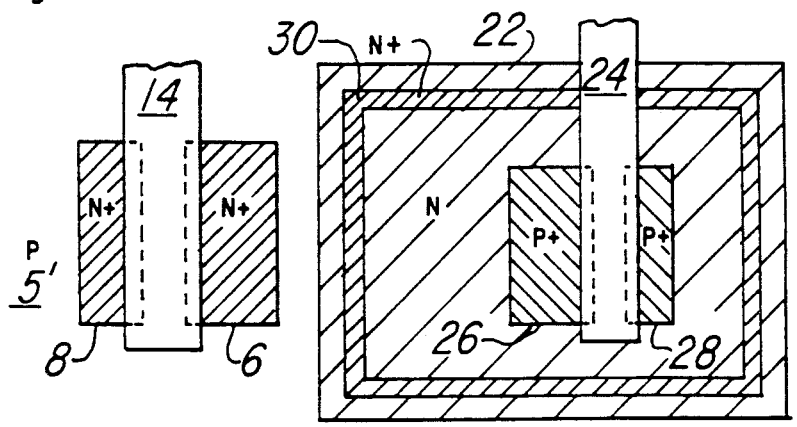
FIG. 4a is a plan view of the CMOS output buffer of FIG. 4.
Figure 4:
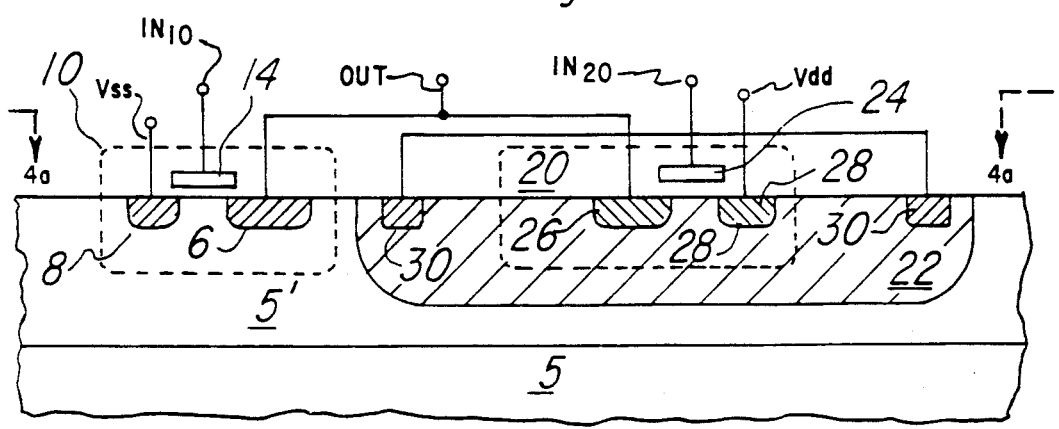
FIG. 4 is a cross-sectional view of a CMOS output buffer constructed according to the prior art.

FIG. 4 illustrates a cross-sectional view of a typical CMOS output buffer which corresponds to the schematic diagram of FIG. 3, and which is constructed according to the prior art. The output buffer of FIG. 4 is fabricated in a p-type epitaxial layer 5', which 5' is a lightly doped p-type layer grown upon p-type substrate 5. The use of epitaxial layer 5' is helpful to reduce the latchup sensitivity of the CMOS circuit, as is well known in the art. N-channel transistor 10 is constructed as described above relative to FIG. 1, with drain region 6 connected to the output terminal via a metal line 4, and with source region 8 connected to $V_{ss}$ by way fo a metal line 4 (both connections illustrated schematically in FIG. 4, for purposes of clarity). Source region 8 and drain region 6 are n-type diffusions made into epitaxial layer 5' as described above. Gate electrode 14 again overlaps the channel region between source region 8 and drain region 6, spaced therefrom by way of gate oxide 15.

P-channel transistor 20 is formed within n-well 22, n-well 22 being an n-type diffusion into epitaxial layer 5'. P-channel transistor 20 has its p-type drain region 26 connected to the output terminal via a metal line 4, and has its p-type source region 28 connected to $V_{dd}$ by way of another metal line 4. Source region 28 and drain region 26 are p-type diffusions made into n-well 22 by diffusion and ion implantation methods well known in the art. Polysilicon gate electrode 24 overlaps the channel region between source region 28 and drain region 26, separated therefrom by thin gate oxide 15, as in transistor 10. P-channel transistor 20 is of course a self-aligned transistor fabricated by way of depositing and patterning gate electrode 24 prior to the formation of the p-type diffusions 26 and 28. Gate electrode 24 is connected to gate electrode 14 from transistor 10, and receives the input signal to the output buffer.

An additional n-type diffusion 30 is provided within n-well 22, and is connected to $V_{dd}$. As is well known in the art, latchup can be substantially prevented if n-well 22 is connected to the same potential as the most positively-biased p-type diffusion within n-well 22. N-type diffusion 30 of FIG. 4 is more heavily doped than n-well 22 in order to facilitate ohmic contact to the metallization 4 (not shown). The connection of n-well 22 to $V_{dd}$ will prevent the p-n junction between source region 28 and n-well 22 from becoming forward biased, thereby preventing latchup of the CMOS output buffer of FIG. 4. The placement of said n-type diffusion 30 has been non-critical, according to prior configurations of CMOS output buffers, so long as connection is made someplace within n-well 22. A common practice has been to form n-type diffusion 30 in a ring around the outside of n-well 22; this has been done not only to avoid layout conflict, but is substantially done to reduce the likelihood of latchup occurring because of charge injection from circuits outside of n-well 22. FIG. 4a is a plan view of the output buffer of FIG. 4, showing the presence of diffusion 30 in a guard ring configuration.

Figure 5:
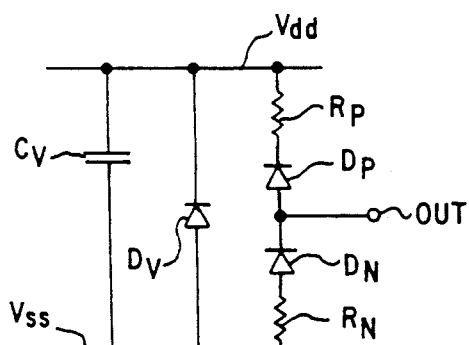
FIG. 5 is a diagram, in schematic form, illustrating the parasitic equivalent circuit for a CMOS output buffer.

A parasitic equivalent circuit for the CMOS output buffer of FIGS. 3 and 4 is shown in FIG. 5. In this circuit, diode $D_p$ corresponds to the p-n junction between drain region 26 and n-well 22, with $R_P$ corresponding to the forward bias resistance of this diode. Since n-well 22 will generally be lightly doped relative to drain region 26, its sheet resistance will be relatively high (on the order of thousands of ohms per square, in contrast to tens of ohms per square within drain region 26). Accordingly, $R_P$ will substantially reside within n-well 22 rather than in the p-type drain diffusion 26. Similarly, diode $D_n$ corresponds to the p-n junction between drain region 26 and epitaxial layer 5'; $R_n$ corresponds to the forward bias resistance of this diode which, for reasons similar to that described for $R_P$, will depend upon the resistivity of epitaxial layer 5'. Diode $D_v$ corresponds to the parasitic diode existing between supplies $V_{dd}$ and $V_{ss}$ (for example, the diode between n-well 22 and epitaxial layer 5', substrate 5 generally being at $V_{ss}$), while capacitance $C_v$ is the capacitance therebetween. In modern integrated circuits, especially those using CMOS, sufficient interconnections carrying $V_{dd}$ and $V_{ss}$ are fabricated in diffusion areas so that the value of capacitance $C_v$ can range from 2000 pF to 10000 pF.

Figure 6:
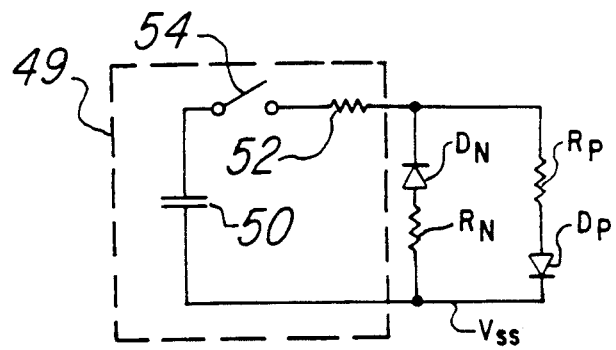
FIG. 6 is a diagram, in schematic form, illustrating the circuit of FIG. 5 connected to an ESD source.

Referring now to FIG. 6, the connection of a human body model ESD source 49 to the parasitic equivalent circuit of FIG. 5 is illustrated schematically. As discussed above relative to Method 3015.3 of MIL-STD-883C, the model consists of capacitor 50 having a value of 100 pF, connected in series with resistor 52 having a value of 1500 ohms; relay 54 is connected therebetween for application of the charge stored in capacitor 50 to the circuit under test by source 49. As is evident from FIG. 6, parasitic capacitor $C_v$ is removed from the equivalent circuit. Since the value of $C_v$ is significantly greater than the 100 pF value of capacitor 50 (and since the value of the voltage to which capacitor 50 is charged relative to the value of $V_{dd}$, which is generally 5 volts), the assumption may be made that $V_{ss}$ and $V_{dd}$ are common for purposes of modeling the behavior of the output buffer in response to an ESD event. The effect of diode $D_v$ may also be ignored with no loss of accuracy since, as will be apparent from the discussion below, the series resistance of diodes $D_n$ and $D_P$ will control the discharge path.

In the event of a positive polarity ESD event, diode $D_P$ will be forward biased, and diode $D_n$ will be reverse biased. However, a voltage will occur across resistor $R_P$ and diode $D_n$ as the current is conducted through resistor $R_P$. It is evident from FIG. 6 that if the current is at a high enough level, the voltage across resistor $R_P$ and, as a consequence, diode $D_n$ in the reverse direction could exceed the reverse-bias breakdown voltage of diode $D_n$. As discussed above relative to FIG. 1b, damage can result from localized heating when the drain-to-substrate diode $D_n$ breaks down in the reverse direction, due to the effect of the parasitic n-p-n bipolar transistor. Therefore, for purposes of ESD sensitivity, the value of $R_P$ should be kept below a certain level so that reverse bias breakdown of transistor 10 is avoided below a certain desired failure threshold.

This value for resistor $R_P$ can be easily calculated for a given desired failure threshold and knowing the reverse bias breakdown threshold of transistor 10. For example, assume that the desired failure threshold, using the human body model of the above-referenced MIL-STD-883C, Method 3015.3, is 6000 volts. The peak current which will appear at bond pad 2 will thus be 4 amperes (6000 volts divided by the 1500 ohms presented by resistor 52). The maximum value of $R_P$ can be calculated by the following equation:

$$V_{Bn} = V_{onp} + (R_P * 4A)$$

where $V_{Bn}$ is the reverse-bias breakdown voltage of diode $D_n$, and where $V_{onp}$ is the forward bias voltage drop across diode $D_P$ (generally 0.7 volts for silicon diodes). By way of example, if 20 volts is the reverse-bias breakdown voltage of diode $D_n$, the maximum value of $R_P$ to avoid reverse-bias breakdown of diode $D_n$ can be calculated:

$$R_P = (20.0 - 0.7) \text{ volts} / 4A = 4.825 \text{ ohms}$$

Such values of parasitic "on" resistance have not been achieved in prior CMOS output buffers. Accordingly, such output buffers have had their ESD sensitivity limited by the ability of transistor 10 to safely conduct the discharge in reverse-bias breakdown.

Figure 8:
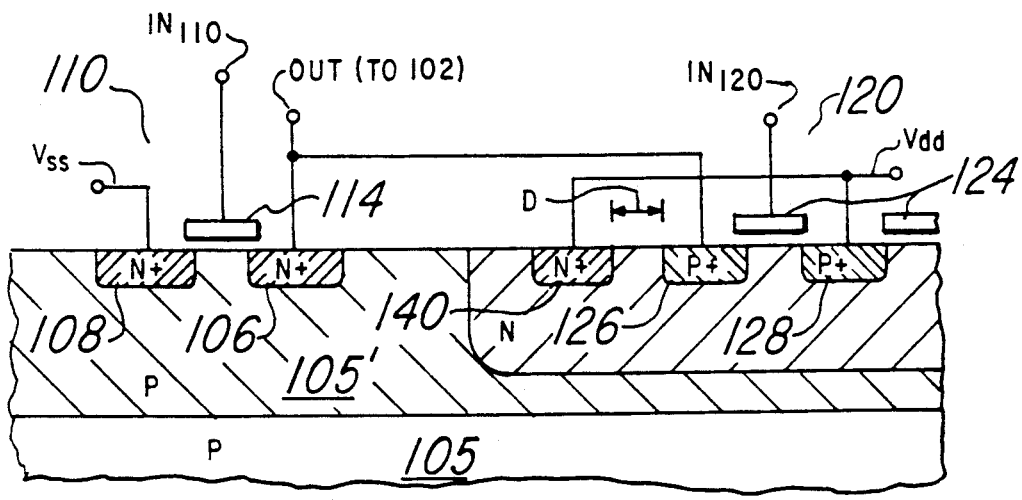
FIG. 8 is a cross-sectional view of a portion of the output buffer of FIG. 7.
Figure 7:
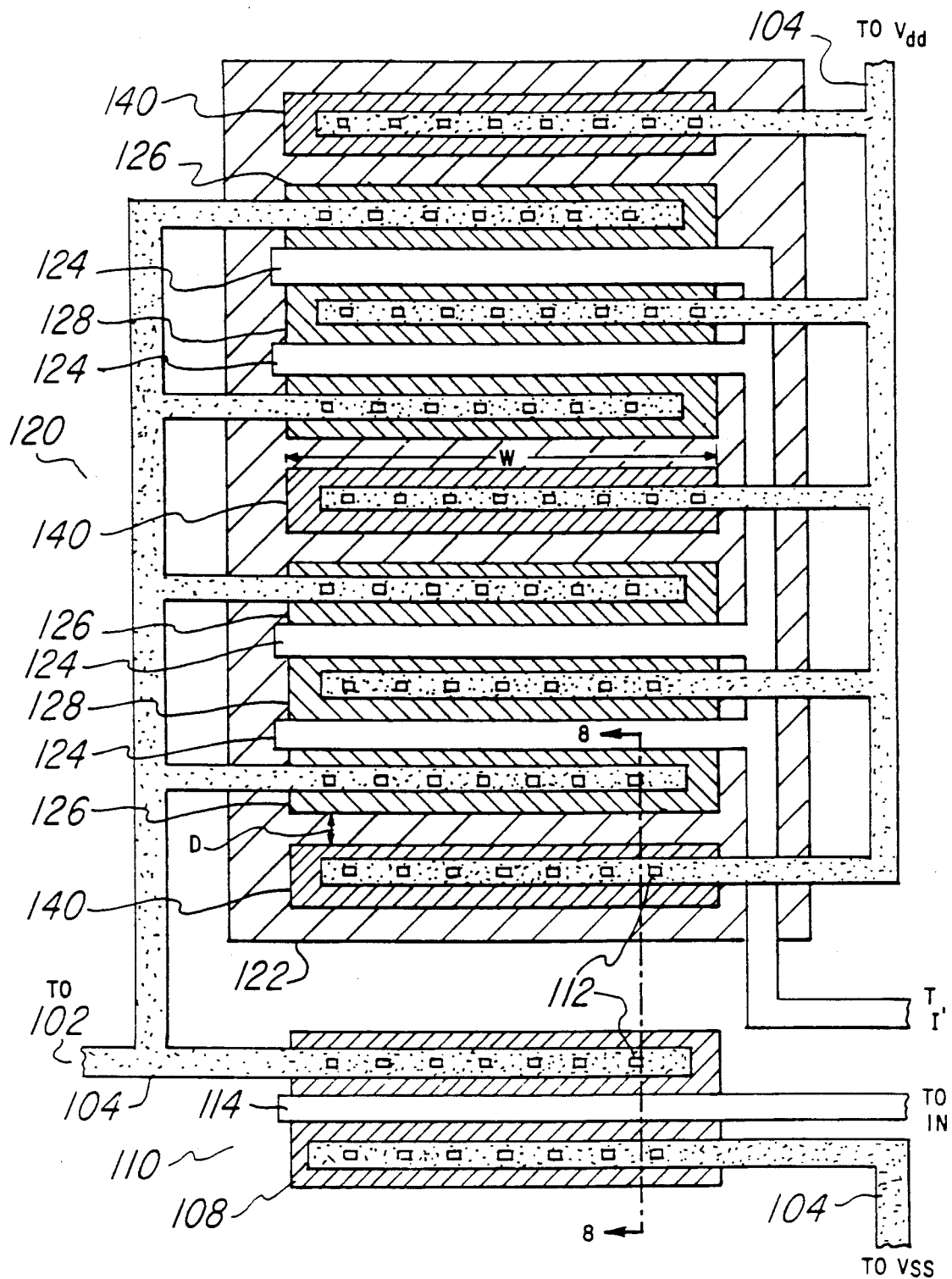
FIG. 7 is a plan view of a CMOS output buffer constructed according to the invention.

Referring now to FIG. 7, a plan view of an output buffer constructed according to the invention is illustrated; a cross-sectional view of a portion of this output buffer is shown in FIG. 8. N-channel transistor 110 is fabricated in the same manner as transistor 10 shown in FIG. 4. Transistor 120 is formed in n-well 122 as shown for the CMOS output buffer of FIG. 4; by way of example, the sheet resistance of n-well 122 according to a preferred embodiment of the invention is typically in the range of 1000 to 4000 ohms/square. Gate electrode 124 has four "fingers", each of which overlaps a region of n-well 122 between elongate drain regions 126 and elongate source regions 128, which are formed to be rectilinear. As before, drain regions 126 and source regions 128 are p-type diffusions made into n-well 122 after deposition and patterning of gate electrode 124 so that the resultant transistor is self-aligning; by way of example, the sheet resistance of source regions 128 and drain regions 126 is typically in the range from 30 to 40 ohms/square. Drain regions 126 are connected to a metal line 104, via contacts in the insulating dielectric, for connection to bond pad 102 (not shown) serving as the output terminal. Source regions 128 are connected, also via a metal line 104 by way of contacts 112, to the $V_{dd}$ reference supply. Gate electrode 124 is, as before, formed of polysilicon and is connected to an input $IN_{120}$ to the output buffer (corresponding to terminal $IN_{20}$ in the schematic diagram of FIG. 5). Electrical connection by way of metal lines 104 is schematically illustrated in the cross-section of FIG. 8, for purposes of clarity.

Additional n-type elongate diffusion regions 140 are made into n-well 122 on the sides of drain regions 126 opposite from drain regions 128, and uniformly separated from drain regions 126 by a short distance D. These diffusion regions 140, which are formed to be rectilinear, are connected, by way of contacts 112 and a metal line 104 to the $V_{dd}$ reference supply, along with source regions 128. As discussed above relative to the parasitic model of FIG. 6, $V_{ss}$ and $V_{dd}$ can be considered as common for purposes of the response of the output buffer to an ESD event. Diffusion regions 140 are heavily doped n-type, relative to n-well 122, and may be fabricated with the same ion implantation and subsequent diffusion which form source region 108 and drain region 106 in n-channel transistor 110. By way of example, typical sheet resistances for diffusion region 140 (and also source region 108 and drain region 106) range from 20 to 30 ohms/square. The heavy doping concentration in diffusion region 140 allows, of course, for good ohmic contact between metal line 104 and diffusion region 140; the heavy doping further provides reduced resistance within diffusion region 140, i.e., between its edges and contacts 112, as compared to n-well 122. Accordingly, the bulk of the resistive voltage drop between drain region 126 and contacts 112 (at $V_{dd}$ potential) will occur in the region between the edge of drain region 126 and the edge of diffusion region 140, within the distance D. The length, long dimension or width W of each of diffusion regions 140 is, in this example, the same as the long dimension or width of source regions 128 and drain regions 126; as will be apparent below, such width will assist in reducing the series resistance therebetween.

The distance D is designed to be sufficiently short that the resistance between drain region 126 and the $V_{dd}$ reference supply is low enough so that the p-n junction between drain region 106 and epitaxial layer 105' in n-channel transistor 110 does not break down in reverse bias from a positive polarity ESD event, as discussed above relative to FIG. 6. The resistance $R_p$, as discussed above in the model of FIG. 6, is the resistance between drain regions 126 and the $V_{dd}$ reference supply (at diffusion regions 140) and can be calculated as follows:

$$R_p = (R_{sheet122}) * (D/W_{eff})$$

For purposes of example, the value for the sheet resistance of n-well 122 ($R_{sheet122}$) will be considered to be 3000 ohms/square (within the range described above); the width W of each of the regions is, in this embodiment, approximately 250 microns. As discussed above relative to FIG. 7, the ladder structure provides for an effective transistor width of four times the width of each individual channel. Similarly, the effective width of the region between drain regions 126 and diffusion regions 140 is also four times the width W of one of the regions 140; accordingly, $W_{eff}$ is 1000 microns. For modern integrated circuits such as the preferred embodiment of this invention, a typical minimum spacing between p-type and n-type diffusions is 1.5 microns (which also serves as the channel length for transistors 110 and 120). Using the above values in the above equation, a 1.5 micron value for the distance D will provide for a value for $R_p$ of 4.5 ohms. As discussed above, this value meets the requirement of preventing the reverse breakdown of an n-channel transistor 110 having a reverse breakdown voltage of 20 volts, in the event of a 6000 volt positive polarity ESD event (human body model). In the example above, the ratio of the distance D to the effective width $W_{eff}$ is 1.5 to 1000. As in the example, the distance D should, in practice, be less than one/one hundredth (or one percent) of the effective width $W_{eff}$. It should be noted that the use of diffusion region 30 as shown in FIG. 4 and 4a hereinabove would not provide the low resistance provided by diffusion regions 140 of FIG. 7, due to the distance of diffusion region 30 from drain region 28; the structure of FIGS. 4 and 4a thus will not preclude the reverse bias breakdown of n-channel transistor 10 as in the case illustrated in FIG. 7 for n-channel transistor 110.

It is evident from FIG. 7 that n-channel transistor 110 is not laid out according to the invention described above relative to transistor 120. It has been found that, for a negative polarity ESD event appearing at bond pad 102, the p-n junction between drain region 126 and n-well 122 will break down in reverse-bias but the "second" breakdown region will not be entered. This is due to the reduced mobility of minority carriers in n-well 122 (compared to the mobility of electrons in epitaxial layer 105'). Accordingly, the additional layout space to reduce the series resistance $R_n$ of transistor 110 is not required, as the junction between drain region 126 and n-well 122 in reverse-bias breakdown is able to safely conduct the discharge, for modern integrated circuits. A preferred layout for n-channel transistor 110 would be the ladder structure of FIG. 2, so that the effective device width would provide even further protection in the event that the failure threshold for which the distance D is determined is exceeded, as discussed above relative to FIG. 2. It should be noted, however, that in the event that the construction of p-channel transistor 120 is done in such a manner that the need arises to protect p-channel transistor 120 from entering reverse-bias breakdown, n-channel transistor 110 may be constructed in the same manner as p-channel transistor 120 shown in FIG. 7 by merely reversing the dopant type of the source and drain diffusions, and by providing the additional diffusion corresponding to diffusion region 140.

Figure 9:
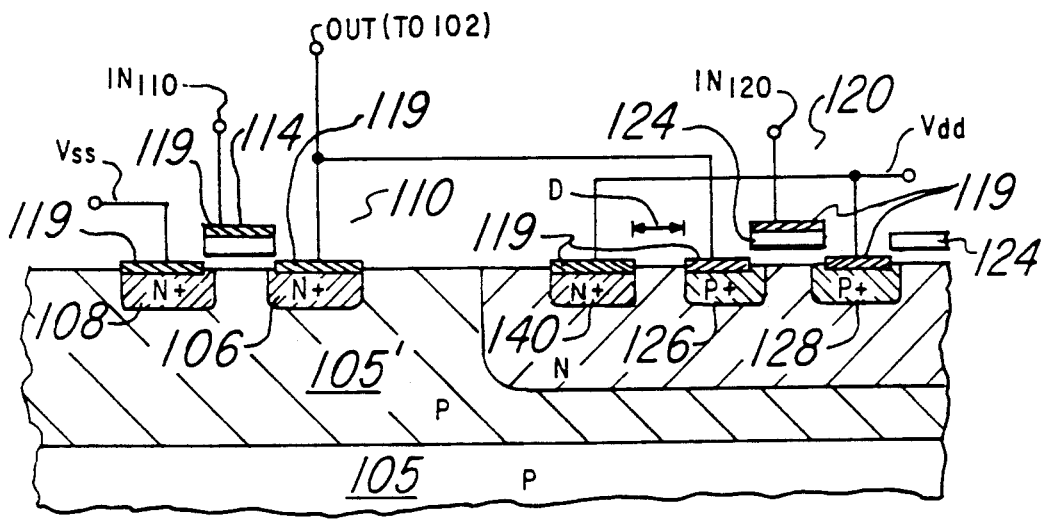
FIG. 9 is a cross-sectional view of a portion of the output buffer of FIG. 7, illustrating the use of silicided conductors.

As discussed above, the use of silicide in cladding the diffusion regions and polysilicon conductors in an integrated circuit aggravated the failure of the output buffer if reverse-bias breakdown occurred (especially in n-channel transistor 10 shown in FIG. 1c). The output buffer illustrated in FIGS. 7 and 8, with the use of diffusion regions 140 properly spaced within transistor 120, is especially useful in such integrated circuits. FIG. 9 is a cross-sectional view of the output buffer of FIG. 7 constructed with silicide film 119 cladding the diffusion regions and polysilicon therein, in the same manner as discussed above relative to FIG. 1c. Typically the sheet resistance of silicide film 119 ranges from 1 to 2 ohms/square; accordingly, the resistance between diffusion regions 140 and drain regions 126 in transistor 120 of FIG. 7 will be even more confined to the region of n-well 122 therebetween. In the same manner as described hereinabove relative to FIGS. 7 and 8, the low series resistance value $R_p$ will assist in keeping the voltage at terminal OUT from rising above the reverse-bias threshold voltage of transistor 120. Accordingly, so long as the p-n junction between drain region 106 and epitaxial layer 105' does not break down in reverse-bias, the use of silicide film 119 does not adversely affect the sensitivity of the device to an ESD event; as discussed above the distance D is designed specifically to avoid this region of operation.

It should be noted that the ladder structure shown in FIGS. 7 through 9 for transistor 120 is used for reducing the surface area of the integrated circuit required to create the necessary width for resistance $R_p$ to be below the calculated maximum. Of course, other variations in the process and construction could allow the resistance value $R_p$ to reach the desired value without use of the ladder structure (i.e., a single length of diffusion region 140 could be utilized). It has been determined, however, that the ladder structure of FIG. 7 is preferable for current integrated circuits.

It should be apparent from the above description that n-channel transistor 110 is precluded from entering reverse-bias breakdown solely through the operation of the diode between drain regions 126 and n-well 122, with the series resistance reduced by way of diffusion regions 140 and the connection thereof to the $V_{dd}$ supply. Accordingly, the transistor action of transistor 120 is not necessary for the ESD protection of n-channel transistor 110, but is useful only as the pull-up device for the CMOS output buffer as illustrated in FIG. 3. The invention may therefore be incorporated into non-CMOS output buffers by using the configuration illustrated in FIGS. 7 and 8, but omitting gate electrode 124 and source regions 128.

Figure 10A:
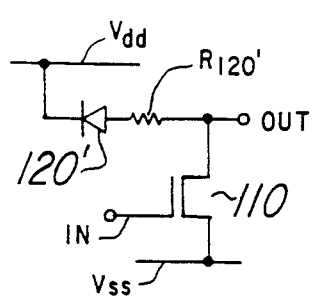
FIGS. 10a through 10c are schematic diagrams of non-CMOS output buffers constructed according to another embodiment of the invention.

FIG. 10a schematically illustrates an example of such a non-CMOS output buffer as an open-drain configuration where no pull-up device is included within the integrated circuit, and which can be protected from an ESD event by the incorporation of a low-series resistance diode constructed according to the invention. FIG. 10a illustrates the incorporation of a diode 120' (corresponding to the diode between p-type drain region 126 and n-well 122), and resistor $R_{120'}$ (the forward bias resistance of diode $R_{120'}$). Connection of the cathode of diode 120' at n-well 122 to supply $V_{dd}$ ensures that diode 120' is reverse-biased during normal operation of the output buffer of FIG. 10a.

Figure 10B:
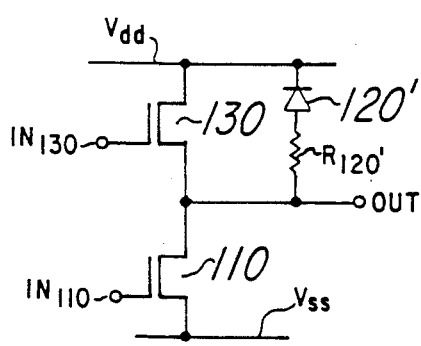
Figure 10C:
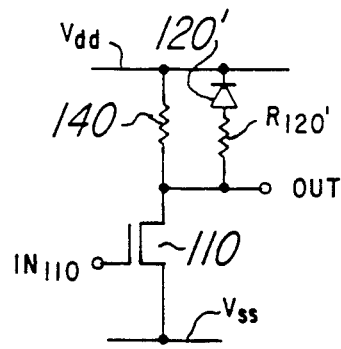

FIG. 10b illustrates another example of a non-CMOS output buffer, where the pull-up device is an n-channel transistor 130; this output buffer is again protected by way of diode 120' and its associated resistance $R_{120'}$ connected in parallel with transistor 130. The gate of transistor 130 is controlled by an input $IN_{130'}$ in a similar manner as a p-channel transistor described above. Similarly as transistor 110 discussed above, n-channel transistor 130 is also protected by diode 120' so long as the voltage drop across diode 120' including its associated resistance $R_{120'}$ remains below the reverse-bias breakdown voltage of the drain-to-substrate diode of transistor 130. FIG. 10c schematically illustrates another output drive circuit protectable by a diode constructed according to the invention, where the pull-up device is a resistor 140. Resistor 140 can consist of any well known integrated circuit resistors, such as a polysilicon or diffusion resistor; resistor 140 could also be a depletion-mode n-channel transistor having its gate connected to the $V_{dd}$ supply. This circuit will be protected to the extent that the series resistance illustrated by $R_{120'}$ remains sufficiently low to prevent the reverse bias breakdown of transistor 110 and the reverse-bias breakdown of resistor 140 if it is constructed as a diffusion resistor or a depletion-mode transistor, and sufficiently low relative to the value of resistor 140 so that the current drawn through resistor 140 remains within its power dissipation capability.

Figure 11:
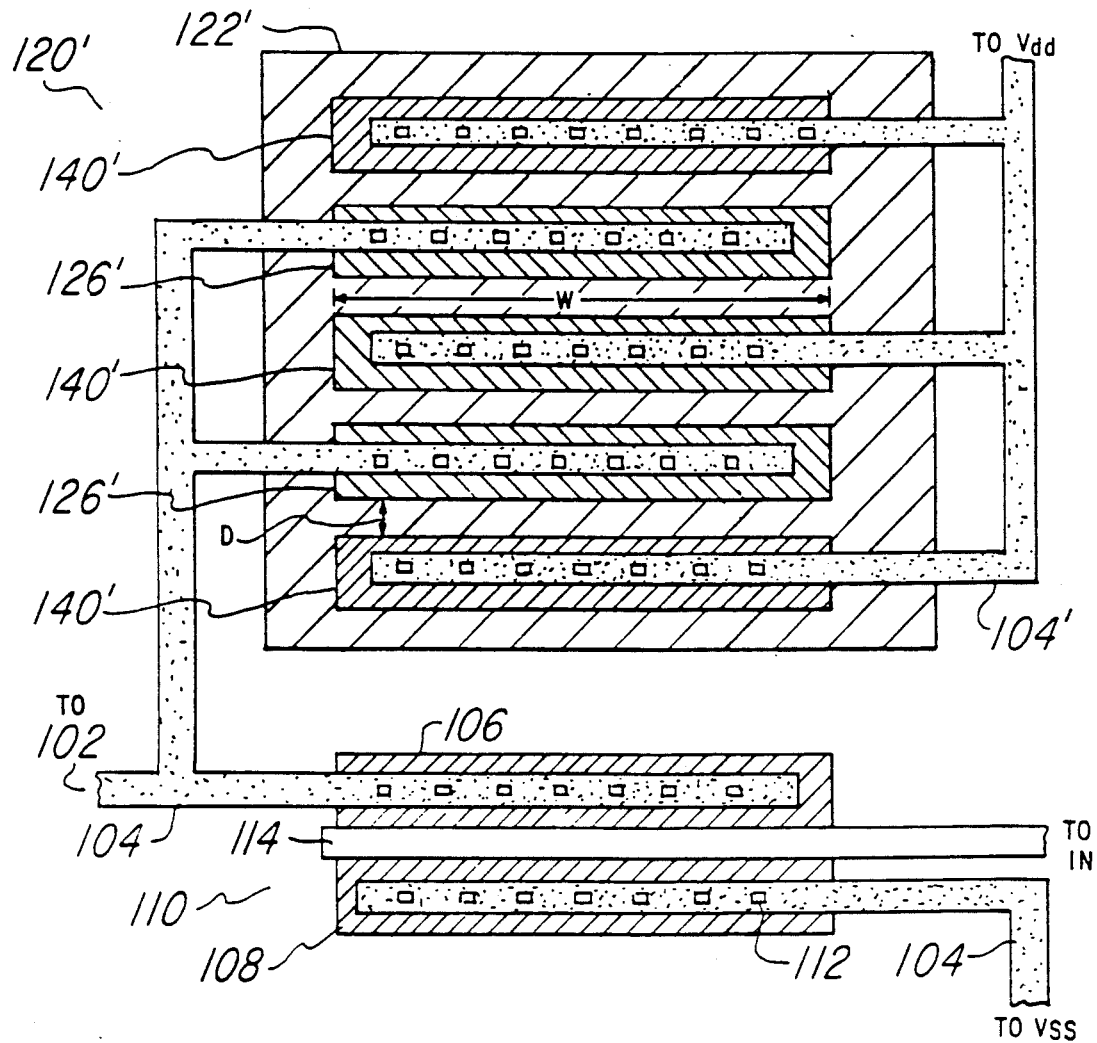
FIG. 11 is a plan view of the output buffer of FIG. 10a constructed according to the invention.

FIG. 11 illustrates the plan view of an output buffer constructed according to this embodiment of the invention, configured in an open-drain configuration as schematically illustrated in FIG. 10a. It should be noted that the construction of diode 120' according to this embodiment of the invention would be identical if used in the configuration of the output buffer according to FIGS. 10b through 10c; the pull-up device would merely be constructed in any of a multitude of well known configurations, and electrically connected in parallel with diode 120'.

Transistor 110 is constructed in the same manner as that shown in FIGS. 7 and 8. Diode 120' of FIG. 11 is formed within n-well 122', in the same manner and with the same geometry size as transistor 120 described above relative to FIGS. 6 and 7, but without gate electrode 124 and source regions 128. P-type regions 126' are diffusions into n-well 122' which are formed in the same manner as drain regions 126 described above relative to FIGS. 7 and 8; p-type regions 126' are connected to bond pad 102 (not shown), at the output terminal of the integrated circuit. N-type diffusion regions 140', as in transistor 110 of FIGS. 7 and 8, are positioned within n-well 122' at a distance D from p-type regions 126', and are connected via metal line 104' to the $V_{dd}$ supply. In this example, as in FIG. 7, the width W of diffusion regions 140' is the same as the width of p-type regions 126'. Diode 120', having the same dimensions W and D as transistor 120 discussed above, similarly provides a series resistance $R_{120'}$ (i.e., $R_p$ of FIG. 6) of approximately 4.5 ohms, similarly preventing the drain-to-substrate diode of transistor 110 from entering reverse-bias breakdown in the event of a positive polarity ESD event of up to 6000 volts according to the human body model.

While the invention has been described in detail herein with reference to its preferred embodiments, it is to be understood that this description is by way of example only, and is not to be construed in a limiting sense. It is to be further understood that numerous changes in the details of the embodiment of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A CMOS output buffer with enhanced electrostatic discharge protection formed in a semiconductor surface on a substrate, comprising:

a. an N-channel transistor having a source connected to a first reference supply, a drain connected to an output pad of the output buffer, and a gate connected to an input of the output buffer;

b. a P-channel transistor formed in a first N-type region of said surface, including a source connected to a second reference supply, a drain connected to said output pad of the output buffer and a gate connected to another input of the output buffer, said P-channel source being formed of plural elongate diffusions and said P-channel drain being formed of plural elongate diffusions on both long sides of said P-channel source diffusions to form channel regions; and c. plural, separate diffusion regions each formed in said semiconductor surface on a side of said P-channel drain diffusions opposite said P-channel source diffusions, said plural diffusion regions each being connected to said second reference supply to furnish electrostatic discharge protection of said N-channel transistor.

2. The buffer of claim 1 in which said diffusion regions are uniformly spaced from said P-channel drain diffusions.

3. The buffer of claim 1 in which there are two P-channel source diffusions, four P-channel drain diffusions and three diffusion regions.

4. The buffer of claim 1 in which there is one diffusion region between two P-channel drain diffusions.

5. The buffer of claim 1 in which said diffusion regions extend only along the long side of each P-channel drain diffusion.

6. The buffer of claim 1 in which said P-channel source and drain diffusions and said diffusion regions each have substantially equal dimensions.

7. The buffer of claim 1 in which said P-channel source and drain diffusions and said P-channel drain diffusions and diffusion regions are closely spaced by about the same distance D.

8. The buffer of claim 1 in which said P-channel source and drain diffusions and said diffusion regions have long sides defined by about the same width W.

9. The buffer of claim 1 in which said P-channel drain diffusions and diffusion regions are uniformly separated by about a distance D, said P-channel drain diffusions and diffusion regions have long sides defined by about the same width W and the effective width Weff of said plural diffusion regions is much greater than said distance D.

10. The buffer of claim 9 in which said distance D has a ratio to said effective width Weff of about 1.5 to 1000.

11. The buffer of claim 10 in which said first N-type region of said surface has a sheet resistance of about 3000 ohms/square to effect a resistance between said P-channel drain diffusion and said diffusion region of about 4.5 ohms.

12. The buffer of claim 9 in which said effective width Weff is about four times the width W of one diffusion region.

13. The buffer of claim 11 in which said resistance is selected to result in a reverse bias voltage at said drain of said N-channel transistor that is less than the secondary breakdown voltage of said drain of said N-channel transistor during a positive polarity ESD event of about 6000 volts in a human body model.

14. The buffer of claim 1 in which said first N-type region is lightly doped and said P-channel source and drain diffusions and said diffusion regions are heavily doped.

15. The buffer of claim 1 in which said N-channel transistor is formed in a P-type region of said surface.

16. The buffer of claim 1 in which said first reference supply is $V_{ss}$ and said second reference supply is $V_{dd}$.

17. The buffer of claim 1 in which said diffusion regions are heavily doped N-type and are formed in said N-type region.

18. The buffer of claim 1 in which said P-channel drain and source diffusions and said diffusion regions are substantially rectilinear.

19. A CMOS output buffer with enhanced electrostatic discharge protection formed in a semiconductor surface of a substrate, comprising:
   a. a first MOSFET transistor having a source connected to a first reference supply, a drain connected to an output pad of the output buffer and a gate connected to an input of the output buffer;
   b. a second MOSFET transistor having a source connected to a second reference supply, a drain connected to said output pad of the output buffer and a gate connected to another input of the output buffer;
   c. one of said first and second transistors being an N-channel transistor formed in a P-type region of said semiconductor and the other being a P-channel transistor being formed in an N-type region of said semiconductor;
   d. said second transistor having its source and drain formed of respective elongate source and drain diffusions uniformly and closely spaced alongside one another to form at least one channel region; and
   e. plural diffusion regions formed in said semiconductor surface on sides of said elongate drain diffusion opposite said elongate source diffusions, said diffusion regions and said elongate drain diffusions being uniformly and closely spaced from one another a distance D along a length defined as an effective width Weff, the material separating said diffusion regions and said elongate drain diffusions having a certain sheet resistance Rs, and said distance D, said effective width Weff and said sheet resistance Rs being selected to obtain a resistance Rc between said diffusion regions and elongate drain diffusions of no more than a certain value that, during a human body model electrostatic discharge event, results in a voltage across the drain and source of said second transistor that is less than the reverse bias breakdown voltage of the drain and source of the first transistor.

20. The buffer of claim 19 in which said human body model presents 6000 volts through 1500 ohms and said certain value of resistance is about 4.85 ohms.

21. The buffer of claim 19 in which said distance D is about 1.5 micron, said effective width Weff is about 1000 microns and said sheet resistance $R_s$ is about 3000 ohms per square to obtain a certain value resistance $R_c$ of about 4.5 ohms.

22. The buffer of claim 19 in which said reverse bias breakdown voltage of the drain and source of the other transistor is about 20 volts.

23. The buffer of claim 19 in which said at least one transistor has plural elongate source diffusions and has plural elongate drain diffusions on both long sides of said elongate source diffusions, and there are plural elongate diffusion regions each on a side of said elongate drain diffusions opposite said elongate source diffusions.

24. The buffer of claim 19 in which there are two elongate source diffusions, four elongate drain diffusions and three diffusion regions.

25. The buffer of claim 19 in which said at least one transistor and at least one diffusion region are formed in N-type material.

26. The buffer of claim 19 in which said N-type material forms a well in P-type material.

27. The buffer of claim 17 in which said diffusions regions extend only along the long sides of said elongate drain diffusions.

28. The buffer of claim 19 in which said elongate source and drain diffusions and diffusion regions have substantially equal dimensions.

29. The buffer of claim 19 in which said distance D is substantially smaller than said effective width Weff by a ratio of about 1.5 to 1000.

30. The buffer of claim 19 in which said effective width Weff is about four times the length defined as a width W of one elongate diffusion regions.

31. The buffer of claim 19 in which said first reference supply is $V_{dd}$ and said second reference supply is $V_{ss}$.

32. The buffer of claim 19 in which said elongate source and drain diffusions and said diffusion regions are substantially rectilinear.

33. The buffer of claim 19 in which said human body model electrostatic discharge event is of positive polarity.

34. The buffer of claim 19 in which said certain value of resistance $R_c$ obtains through selecting D, Weff and $R_s$ according to the following formula:

$$R_c = R_s * (D/\text{Weff})$$

* * * * *